United States Patent [19]

Gupta et al.

[11] Patent Number: 5,037,506
[45] Date of Patent: Aug. 6, 1991

[54] METHOD OF STRIPPING LAYERS OF ORGANIC MATERIALS

[76] Inventors: Subhash Gupta, 1578 Meadow Ridge Cir., San Jose, Calif. 95131; Bhanwar Singh, 17122 Heatherwood Way, Morgan Hill, Calif. 95037; Ahmad Waleh, 2344 Emerson St., Palo Alto, Calif. 94301

[21] Appl. No.: 579,064

[22] Filed: Sep. 6, 1990

[51] Int. Cl.$^5$ .............................................. H01L 21/00
[52] U.S. Cl. .................................. 156/646; 156/659.1
[58] Field of Search ............................. 156/646, 659.1

[56] References Cited

U.S. PATENT DOCUMENTS 4,520,046  5/1985  McCaskie et al. .................. 156/668
4,778,536  10/1988  Grebinsri ........................ 156/659.1

Primary Examiner—Richard Bueker
Assistant Examiner—George A. Goudreau
Attorney, Agent, or Firm—Benman & Collins

[57] ABSTRACT

Gaseous sulfur trioxide is used to remove various organic coatings, polymerized photoresist, and especially implant and deep-UV hardened photoresist layers, during the manufacture of semiconductor or ceramic devices.

17 Claims, No Drawings

METHOD OF STRIPPING LAYERS OF ORGANIC MATERIALS

BACKGROUND OF THE INVENTION

1. Field of the Invention

The present invention is related to the removal of various organic coatings, polymerized photoresists, and especially implant and deep-UV hardened photoresist layers during the manufacture of semiconductor or ceramic devices.

2. Description of the Related Art

Stripping of the photoresists and other organic polymers is one of the necessary steps in the manufacturing of semiconductor devices. The stripping of photoresists and organic masks is usually carried out by one of two methods, commonly known as dry and wet stripping or etching. Wet stripping of photoresists, typically involves the use of specialized oxidizing solutions such as Caro's acid and other organic strippers. Dry stripping methods, on the other hand, remove photoresists by oxygen plasma (ashing), and in some cases, with the assistance of hydrogen plasma. However, as semiconductor device geometries increasingly move into submicrometer range, neither dry nor wet stripping techniques seem to provide a satisfactory solution to the problem of complete removal of the photoresists, without damaging the device. Often, a combination of both methods or even consecutive steps of dry plasma etching must be used to achieve this goal.

The major problem with the wet stripping methods arises from the surface hardening of the photoresists due to reactive ion etching (RIE) or ion implantation processes. Similarly, post bakes and UV cures may cause chemical changes in the photoresists that would cause the removal of the resists to be incomplete by conventional wet strippers. Dry plasma etching, using oxygen (ashing), provides an attractive alternative in such cases. However, ashing techniques have also proved, in many instances, to suffer from similar limitations as wet stripping methods. For example, in the case of high-dose ion-implanted resist layers, impurities in the resist may give rise to ash-resistant oxides, which must then be removed by hydrogen plasma followed by ashing and downstream stripping.

Other problems associated with plasma etching and ashing include radiation damage and residual contaminations. Sidewall polymer formations can also occur as a result of the interaction of the released by-products of the plasma etching with the sidewalls of the resist structure. Such polymers cannot be easily removed by simple ashing techniques. A major problem arises from metal impurities typically found in the commercial photoresists. Ashing not only is ineffective in removing trace metal contaminants, it may cause the metal impurities to be driven into the silicon substrates by the high-energy plasma. Wet strips are, in principle, more efficient in removing metal impurities. However, wet strips leave behind the metallic impurities, indigenous to solvents themselves, along with trace organic residues resulting from resist build-up in the solution. They are also not very effective in removing chemically altered resists.

Both methods suffer from severe limitations when organic materials are present in submicrometer grooves and narrow crevices. Both grooves and crevices render the wet strip solutions ineffective by limiting the solvent access, due to surface tension and capillary actions, to the organics. Dry ashing often fails to completely remove photoresists from crevices due to micromasking of the resists by the sputtered oxide (e.g., in planarization processes). On the other hand, in the case of submicrometer grooves, removal of the polymers formed on the side-walls becomes ineffective due to the composition of these polymers. Post etch clean-ups involving removal of the polymeric side wall coating from submicrometer grooves also suffer similar handicaps.

Oxide etch processes also leave carbon-fluorine polymers which are often difficult to remove by dry or wet methods. Even successive application of dry and wet strip followed by RCA clean (a process developed by RCA which involves treatment by $NH_4OH/H_2O_2$ followed by $HCl/H_2O_2$) is not very effective in removing such polymers. Finally, both wet and dry stripping techniques present problems in removal of the photoresists used in deep-UV lithographic techniques.

At the present time, a satisfactory method of one-step-removal of photoresists and polymer films, without trace metal contamination problems, and applicable to submicrometer grooves and crevices is not available. The ability to provide a simple method of resist stripping, without the limitations of the conventional wet and dry strippers, should prove very beneficial in improving the architecture, efficiency, throughput, and the performance of the semiconductor devices and related technologies.

SUMMARY OF THE INVENTION

Accordingly, it is an object of the present invention to provide a process of organic mask and coat remover to be used for stripping and removal of all organic materials and polymers, positive and negative photoresists, resins, and multilayer organic polymers from semiconductor devices with wafers and PC boards as common examples.

It is also an object of the present invention to provide such a process that may be extended for use in removing photoresists and other polymers that may become hardened by reactive ion etching, ion implant, UV curing, high-temperature post-bakes, and various plasma processes.

It is yet a further object of the present invention to provide such a process that can be used to strip and remove organic matters and photoresist, that have been treated by deep-UV lithographic techniques.

It is yet another object of the present invention to provide such a process that can be used to strip and remove organic matter, particularly from the walls of submicrometer grooves, where side-wall passivation polymers are formed and deposited, and submicrometer crevices, where the photoresists can be trapped due to micromasking by sputtering of the substrate layers, in particular, silicon oxide.

It is a still further object of the present invention to provide such a process that can be used to strip and remove metal impurities and contaminants that may be present in the photoresists, or introduced as part of the wafer or device processing, including the cases where such metal impurities are driven into the resist layers by energetic particles in the etching or ashing plasma.

It is yet another object of the present invention to provide such a process that can remove and strip all post-etch polymer layers that may be deposited on the device surface, and all organic contaminants that may accumulate on the device surface as a result of pumps and other auxiliary system operations.

In accordance with the invention, a novel stripping agent comprising sulfur trioxide is used, which oxidizes and removes all types of photoresist layers, coatings, and polymers from the surface of the device. Regulated quantities of gaseous sulfur trioxide are dispensed into chambers or series of closed chambers, with good vacuum integrity, that house organic-coated devices after initial flushing with inert gases. Liquid sulfur trioxide, primarily in the gamma form, may be stored and used as the source of vapor. Sulfur trioxide is a much stronger oxidizing agent than the sulfuric/peroxide solutions, and is much more effective on the plasma-hardened photoresists or post-etch, carbon-fluorine containing polymers. Sulfur trioxide is particularly suitable for stripping resists and side-wall polymers from submicrometer grooves and crevices. Being in vapor phase, it does not suffer from surface tension and capillary action problems that limit the action of strip solutions by preventing contact with the walls of such grooves and crevices.

The use of one-step sulfur trioxide stripping provides for a more efficient, cleaner, and safer processing of semiconductor wafers and other related devices. The vapor form of the material prevents introduction of additional impurities, particularly metal impurities, in the device production process.

DETAILED DESCRIPTION OF THE INVENTION

Details of a specific embodiment of the present invention is described to illustrate the best mode presently contemplated by the inventors for practicing the invention. Alternative embodiments are also briefly described as applicable.

A process has been designed and developed to strip organic layers and polymers, whether used as photoresist coatings on the surface or polymerized and deposited in the course of etching, in the course of manufacturing of wafers and other semiconductor or ceramic devices. It is an important feature of this invention that the process can remove polymerized photoresists and, specially, implant and deep-UV hardened photoresist layers which ordinarily are not removed completely by convention wet stripping or dry ashing methods. A particularly important feature of this invention is that it removes micromasked resists and polymer deposits from submicrometer grooves and crevices, which would be inaccessible to liquid strips.

The basic concept behind this invention is that a novel stripping agent comprising of sulfur trioxide is used, in vapor form, to oxidize and remove all types of photoresist layers, coatings, and polymers from the surface of the device. Sulfur trioxide, being an extremely strong oxidizing agent, is very effective in removing plasma-hardened photoresists or post-etch, carbon-fluorine containing polymers. The vapor form of sulfur trioxide, coupled with its oxidizing power, allows for stripping of resists and side-wall polymers from submicrometer grooves and crevices. Being in vapor phase, it does not suffer from surface tension and capillary-action problems that limit the action of strip solutions by preventing contact with the walls of submicrometer grooves and crevices. The oxidizing power of sulfur trioxide is uniquely suitable for removal of side-wall polymers.

In the process of the invention, liquid sulfur trioxide, which is primarily in gamma form, is stored and used as oxidizing agent. Gamma-sulfur trioxide, with a melting point of 16.8° C. (62.2° F.), is the desirable form for sulfur trioxide to be used in the invention, and is the form that SO, exists in when it is maintained absolutely pure and anhydrous. In general, stabilized gamma-sulfur trioxide is used, where addition of a small quantity of inhibitor (stabilizer) prevents formation of the high melting-point beta (32.5° C.) and alpha (62.3° C.) forms. Gamma-sulfur trioxide is commercially available with such inhibitors. The stabilized sulfur trioxide can readily be remelted, if it is allowed to solidify. Unstabilized liquid sulfur trioxide may also be used for specific applications.

The stripping process of the invention is advantageously employed in both batch and continuous operation modes. In either case, regulated quantities of gaseous sulfur trioxide are dispensed, continuously or at appropriate intervals, into closed, vacuum-sealed chamber(s) that house organic-coated wafers and devices. The chambers(s) are purged with inert or dry nitrogen gas, prior to dispensing of sulfur trioxide into the chamber(s), primarily to minimize the moisture level which can, additionally, be assisted by maintaining the walls of the chamber(s) at elevated temperatures. The flow rate and pressure of the sulfur trioxide gas and the time of exposure needed for stripping will depend on type of coating, nature of polymers, and the chemical changes they undergo in the course of plasma treatment of wafer or device. These factors also depend on the size of chamber and the quantities of the wafers and devices to be stripped in a single batch or in a continuous automated mode of operation.

While the time of exposure of the coated wafers or devices to the gaseous sulfur trioxide varies, depending on several factors, as indicated above, the typical time of exposure is about 5 to 150 sec. Depending on the coating and processing conditions, longer times or repeated exposure may be needed. However, the determination of the time for a particular coating and set of conditions is easily done, and constitutes no undue experimentation.

The wafer or device may be maintained at room temperature during exposure to the gaseous sulfur trioxide or heated to an elevated temperature. If heated, the temperature may range as high as about 150° C.

The etch rate depends on the particular coating and set of process conditions. Typically, the etch rate is in the range of about 1 to 12 $\mu$m/min.

Following removal of the coating by exposure to the gaseous sulfur trioxide, the wafer or device is rinsed in a solution to remove any reaction products. While water is preferred as the rinse medium, other solvents may also be employed, such as the lower alkanols (1 to 5 carbon atoms), especially iso-propyl alcohol, acetone, and mixtures thereof.

The process of the invention has no deleterious effect on the semiconductor surface or on any non-organic coatings thereon. That is, surface oxides, nitrides, oxynitrides, metals, silicides, polysilicon, and the like are unaffected by the process.

Without subscribing to a particular theory and independent of the details of the sulfur trioxide reactions, the underlying principle of the operation in the invention is the exhaustive oxidation of all organic coatings and polymers, which is made possible by the access of sulfur trioxide vapor to all elements of the device surface, including grooves and crevices and other submicrometer structures. The process of the invention can be carried out whether sulfur trioxide is used in the form of pure or stabilized gas, or vaporized from a pure or stabilized liquid sulfur trioxide. The process of the invention equally applies when the reactivity of the sulfur trioxide vapor is obtained from a mixture of chemical substances, in gaseous, liquid, or solid form, with the net effect of producing sulfur trioxide vapor, in pure form or otherwise, at the rate and quantity needed to carry out specific stripping reactions.

Interaction of sulfur trioxide with both positive and negative photoresists, spun and baked on silicon substrates, results in complete removal of the photoresist layer. A complete stripping of the photoresists also occurs rapidly from surfaces of polysilicon, oxides, nitrides, oxynitrides, and metals. Substrate surfaces are typically spin coated with 1.0 to 2.0 µm thick photoresists containing appropriate photosensitizers (g-line, i-line, deep-UV, etc.) and exposed to generate photoresist patterns on these substrates.

In general, the invention process has the capability to remove both positive and negative photoresists, with different histories of UV-exposure and plasma treatment, from the surfaces of the substrates used in IC manufacturing. In particular, resists and polymers which are exposed to deep UV, ion implant, and other harsh plasma treatments can readily and efficiently be removed by the oxidizing action of sulfur trioxide vapor. The stripping process remains equally effective when submicrometer structural features are added to semiconductor devices.

EXAMPLES

Example 1

Based on the above principle, the process of photoresist stripping was tested for a batch of silicon wafers which were spin-coated with 1.2 micrometers of positive-type photoresist (Novolac-type resin) on a spin track at 4000 rpm for 30 seconds. The wafers were then baked on a hot plate at 100° C. for 60 seconds, and were exposed to g-line (436 nm, 130 mJ/cm$^2$ or I-line (365 nm, 160 mJ/cm$^2$) radiation through a pattern-mask. The exposed wafers were then developed in an alkaline developer for 65 seconds, followed by water rinse to generate resist patterns.

Exposure of the patterned wafers to sulfur trioxide vapor for 45 seconds, followed by rinsing with water, resulted in complete removal of the organic coatings (photoresists) from the exposed surfaces.

Example 2

The process of stripping was tested for a batch of silicon wafers which were spin coated with a 1.0 micrometer coating of negative-type photoresist (poly p-vinyl phenol) at 4000 rpm for 45 seconds and baked, on a hot plate, at 100° C. for 60 seconds. The negative-type resist was sensitive to deep-UV radiation and, therefore, was exposed, through a pattern mask, to 25 mJ/cm$^2$ of 248 nm radiation produced by a KrF excimer laser. After 60 seconds of postexposure bake at 130 C, the exposed wafers were developed in alkaline developer (0.24 N MF319, a product of Shipley Company, which contains tetra-methyl ammonium hydroxide) for 65 seconds to generate resist patterns.

Exposure of the patterned wafers to sulfur trioxide vapor for 45 seconds followed by rinsing with water resulted in complete removal of the organic coatings (photoresists) from the exposed surfaces.

Example 3

The process of stripping was tested for a batch of wafers with oxidized silicon surfaces which were prepared and treated by the following processes:
(1) Wafers were spin-coated with a positive-type photoresist, exposed, and developed in the same manner as described in Example 1.
(2) The patterned resists were additionally etched in a batch hexode-type RIE system, with a DC bias of 550 volts and RF power of 0.67 W/cm$^2$, for 5 minutes.

Exposure of the RIE-treated wafers to sulfur trioxide vapor for 50 seconds, followed by rinsing with water, did not remove all the organic coatings (photoresist) from the exposed surfaces. After drying and re-exposure of the wafers to sulfur trioxide for an additional 2 minutes, followed by water rinse, however, the process removed all organic coatings successfully.

Example 4

The process of stripping was tested for a batch of TiN 350 Å/Al (6000 Å) substrate surfaces, prepared and treated by the following processes:
(1) Wafers were spin-coated with a positive-type photoresist in the same manner as described in Example 1.
(2) The resist coating were then exposed to an I-line stepper, followed by a post-exposure baking step at 110° C. for 60 seconds. The resist was then developed in an alkaline solution to generate resist patterns.
(3) The patterned resists were further dried by baking at 100° C. for 60 seconds, followed by flood exposure (no mask) to a broad-band UV-source (240 to 320 nm) at 160° C., to enhance cross-linking.

Exposure of the resulting patterned wafers to sulfur trioxide vapor for 45 seconds, followed by rinsing with water, resulted in complete removal of the organic coatings (photoresists) from the exposed surfaces.

The foregoing description of the preferred embodiment of the present invention has been presented for purposes of illustration and description. It is not intended to be exhaustive or to limit the invention to the precise form disclosed. Obviously, many modifications and variations will be apparent to practitioners skilled in the art. It is possible that the invention may be practiced in MOS, bipolar, photoelectronic, microwave, or photoacoustical fabrication technologies. Similarly, any process steps described might be inter-changeable with other steps in order to achieve the same result. The embodiment was chosen and described in order to best explain the principles of the invention and its practical application, thereby enabling others skilled in the art to understand the invention for various embodiments and with various modifications as are suited to the particular use contemplated. It is intended that the scope of the invention be defined by the claims appended hereto and their equivalents.

What is claimed is:

1. A process for substantially completely removing organic coatings on the surface of a semiconductor wafer, said process comprising exposing said organic coating to a vapor consisting essentially of water-free gaseous sulfur trioxide, said wafer being maintained at a temperature ranging from about room temperature to 150° C.

2. The process of claim 1 further comprising rinsing said surface in a solvent subsequent to exposing said organic coating to said gaseous sulfur trioxide.

3. The process of claim 2 wherein said solvent consists essentially of a member selected from the group consisting of water, lower alkanols, acetone, and mixtures thereof.

4. The process of claim 3 wherein said solvent consists essentially of water or iso-propanol.

5. The process of claim 1 wherein said organic coating is exposed to said gaseous sulfur trioxide at a temperature of about room temperature.

6. The process of claim 4 wherein said exposure is performed for a period of time ranging from about 5 to 150 sec.

7. The process of claim 1 wherein said organic coating comprises a photoresist.

8. A process for substantially completely removing organic coatings on surfaces, said process comprising (a) exposing said organic coating to a vapor consisting essentially of water-free gaseous sulfur trioxide, said organic coating being maintained at a temperature ranging from about room temperature to 150° C., and (b) rinsing said surface in water subsequent to exposing said organic coating to said gaseous sulfur trioxide.

9. The process of claim 8 further comprising repeating steps (a) and (b) at least once.

10. The process of claim 8 wherein said organic coating is exposed to said gaseous sulfur trioxide at room temperature.

11. The process of claim 10 wherein said exposure is performed for a period of time ranging from about 5 to 150 sec.

12. The process of claim 8 wherein said organic coating comprises a photoresist.

13. A process for substantially completely removing photoresist coatings on semiconductor wafers, comprising:
    (a) placing said wafer in a chamber;
    (b) purging said chamber with a dry gas selected from the group consisting of an inert gas and nitrogen; and
    (c) introducing a vapor consisting essentially of water-free gaseous sulfur trioxide into said chamber to react with said photoresist coating, said photoresist coating being maintained at a temperature ranging from about room temperature to 150° C.

14. The process of claim 13 wherein said water is subsequently rinsed in a solvent consisting essentially of water or iso-propanol to remove any reaction products.

15. The process of claim 14 wherein a process cycle comprises exposing said wafer to said gaseous sulfur trioxide and rinsing said wafer in said solvent, said process cycle being performed at least twice.

16. The process of claim 13 wherein said organic coating is exposed to said gaseous sulfur trioxide at a temperature of about room temperature.

17. The process of claim 13 wherein said wafer is exposed to said gaseous sulfur trioxide for a period of time ranging from about 5 to 150 sec.

* * * * *